US006662448B2

(12) United States Patent
Kubby et al.

(10) Patent No.: US 6,662,448 B2
(45) Date of Patent: Dec. 16, 2003

(54) METHOD OF FABRICATING A MICRO-ELECTRO-MECHANICAL FLUID EJECTOR

(75) Inventors: Joel A. Kubby, Rochester, NY (US); Jingkuang Chen, Ann Arbor, MI (US); Feixia Pan, Webster, NY (US)

(73) Assignee: Xerox Corporation, Stamford, CT (US)

(*) Notice: Subject to any disclaimer, the term of this patent is extended or adjusted under 35 U.S.C. 154(b) by 196 days.

(21) Appl. No.: 09/863,637

(22) Filed: May 23, 2001

(65) Prior Publication Data

US 2001/0023523 A1 Sep. 27, 2001

Related U.S. Application Data

(62) Division of application No. 09/415,628, filed on Oct. 12, 1999, now abandoned.
(60) Provisional application No. 60/104,356, filed on Oct. 15, 1998.

(51) Int. Cl.[7] ............................ B21D 53/76; H05K 3/02
(52) U.S. Cl. .......................... 29/890.1; 29/847; 29/831; 438/21; 347/20; 347/68
(58) Field of Search ....................... 29/622, 831, 25.35, 29/890.1, 876, 847; 347/68, 70, 20, 54, 71, 72; 438/21

(56) References Cited

U.S. PATENT DOCUMENTS 4,203,128 A * 5/1980 Gucket et al. .............. 331/156
4,818,827 A * 4/1989 Ipcinski et al. ........... 29/622 X
5,812,163 A * 9/1998 Wong .......................... 347/68
6,357,865 B1 3/2002 Kubby et al. ................. 347/68

FOREIGN PATENT DOCUMENTS

JP 63-197652 * 8/1988 ................ 29/890.1
JP 4-370614 * 12/1992 .................. 29/622

OTHER PUBLICATIONS

Hijab et al, "Residual Strain Effects on Large Aspect Ratio Micro–Diaphragms", An Investigation of Micro Structures, Sensors, Actuators, Machines and Robots, IEEE Micro Electro Mechanical Systems, Feb 1989, pp. 133–138.*

Schiller et al, "Surface–Micromachined Piezoelectric Pressure Sensors", Solid State Sensor and Actuator Workshop, IEEE 4$^{th}$ Technical Digest, Jun. 1990, , pp. 187–190.*

* cited by examiner

*Primary Examiner*—A. Dexter Tugbang
(74) *Attorney, Agent, or Firm*—Wayne J. Egan

(57) ABSTRACT

A micro-electromechanical fluid ejector that is easily fabricated in a standard polysilicon surface micromachining process is disclosed, which can be batch fabricated at low cost using existing external foundry capabilities. In addition, the surface micromachining process has proven to be compatible with integrated microelectronics, allowing for the monolithic integration of the actuator with addressing electronics. A voltage drive mode and a charge drive mode for the power source actuating a deformable membrane is also disclosed.

9 Claims, 5 Drawing Sheets

METHOD OF FABRICATING A MICRO-ELECTRO-MECHANICAL FLUID EJECTOR

This application is a divisional of application(s) Ser. No(s). 09/415,628, filed Oct. 12, 1999 now abandoned.

This patent application claims priority to U.S. Provisional Patent Application No. 60/104,356, (D/98191P) entitled "Micro-Electro-Mechanical Ink Jet Drop Ejector" filed on Oct. 15, 1998, the entire disclosure of which is hereby incorporated by reference.

The present invention is directed to a micro-electromechanical drop ejector that can be used for direct marking. The ink drop is ejected by the piston action of an electrostatically or magnetostatically deformable membrane. The new feature of the invention is that it is easily fabricated in a standard polysilicon surface micromachining process, and can thus be batch fabricated at low cost using existing external foundry capabilities. In addition, the surface micromachining process has proven to be compatible with integrated microelectronics, allowing for the monolithic integration of the actuator with addressing electronics. In contrast to the magnetically actuated drop ejector described in U.S. patent application Ser. No. 08/869,946, entitled "A Magnetically Actuated Ink Jet Printing Device", filed on Jun. 5, 1997 and assigned to the same assignee as the present invention, the electrostatically actuated version of the present invention does not require external magnets for actuation of the diaphragm, and does not have the ohmic-losses that arise from the flow of current through the coil windings.

Current Thermal Ink Jet (TIJ) direct marking technologies are limited in terms of ink latitude, being limited to aqueous based inks, and productivity, by the high-power requirements associated with the water-vapor phase change in both the drop ejection and drying processes. The limitation to aqueous based inks leads to limitations in image quality and image quality effects due to heating of the drop ejector. The requirements for high-power in the drop ejection process limits the number of drop ejectors that can be fired simultaneously in a Full-Width Array (FWA) geometry, that is required for high productivity printing. The requirement for high-power drying to evaporate the water in aqueous based inks also leads to limitations in high productivity printers. It is very likely that the next breakthrough in the area of direct marking will be in the area of inks, such as non-aqueous and liquid-solid phase change inks, and a drop ejector with sufficient ink latitude would be the enabler for the use of such inks.

U.S. Pat. Nos. 5,668,579, 5,644,341, 5,563,634, 5,534,900, 5,513,431, 5,821,951, 4,520,375, 5,828,394, 5,754,205 are drawn to microelectromechanical fluid ejecting devices. In the majority of these patents, the ejector is fabricated using bulk micromachining technology. This processing technology is less compatible with integrated electronics, and thus is not cost effective for implementing large arrays of drop ejectors which require integrated addressing electronics and also has space limitations due to sloped walls. The surface micromachining process of the present invention described above is compatible with integrated electronics. This is a very important enabler for high-productivity full-width array applications. An additional feature described above is the "nipple" or landing foot of the present invention. This feature is important for keeping the membrane from contacting the counter-electrode in device operation. The Seiko-Epson device described in the above patents does not have this feature and they must include an insulating layer between the membrane and counter-electrode in order to avoid electric contacts. This insulating layer has a tendency to collect injected charge, which leads to unreproducable device characteristics unless the device is run in a special manner, as described in U.S. Pat. No. 5,644,341. An additional feature of the present invention described above is using a charge drive mode in order to enable gray level printing using multiple drop sizes. The charge drive mode allows the membrane to be deformed to a user selected amplitude, rather than being pulled all of the way down by the familiar "pull-in" instability of the voltage drive mode. Finally, the device of the present invention can be implemented as a monolothic ink jet device, not requiring the high-cost wafer bonding techniques used in the Seiko-Epson patents. The nozzle plate and pressure chamber can be formed directly on the surface of the device layer using either an additional polysilicon nozzle plate layer, or a thick polyimide layer as described in U.S. patent application Ser. No. 08/905,759 entitled "Monolithic Ink Jet Printhead" to Chen et al., filed Aug. 4, 1997 and assigned to the same assignee as the present invention, or U.S. Pat. No. 5,738,799, entitled, "Method and Materials for Fabricating an Ink-Jet Printhead, also assigned to the same assignee as the present invention or as described in a publication entitled "A Monolithic Polyimide Nozzle Array for Inkjet Printing" by Chen et al., published in Solid State Sensor and Actuators Workshop, Hilton Head Island, S.C., Jun. 8–11, 1998. This is an important enabler for bringing down manufacturing cost.

U.S. Pat. Nos. 5,867,302, 5,895,866, 5,550,990 and 5,882,532 describe other micromechanical devices and methods for making them.

All of the references cited in this specification are hereby incorporated by reference.

SUMMARY OF THE INVENTION

The present invention increases ink latitude by eliminating the need for the liquid-vapor phase change in thermal ink jets, and decreases power consumption by three orders of magnitude by using mechanical rather than thermal actuation, and non-aqueous based inks.

DETAILED DESCRIPTION OF THE INVENTION

Figure 1:
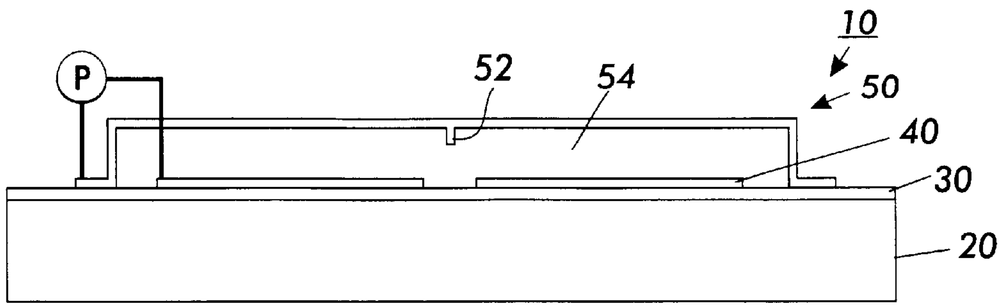
FIG. 1 shows a cross-sectional view of the electrostatically actuated diaphragm in the relaxed state.

FIG. 1 shows a cross-sectional view of electrostatically actuated diaphragm 10 in the relaxed state. Substrate 20 is typically a silicon wafer. Insulator layer 30 is typically a thin film of silicon nitride, $Si_3N_4$. Conductor 40 acts as the counterelectrode and is typically either a metal or a doped semiconductor film such as polysilicon. Membrane 50 is made from a structural material such as polysilicon, as is typically used in a surface micromachining process. Nipple 52 is attached to a part of membrane 50 and acts to separate the membrane from the conductor when the membrane is pulled down towards the conductor under electrostatic attraction when a voltage or current, as indicated by power source P, is applied between the membrane and the conductor. Actuator chamber 54 between membrane 50 and substrate 20 can be formed using typical techniques such as are used in surface micromachining. A sacrificial layer, such as chemical vapor deposition (CVD) oxide is deposited, which is then covered over by the structural material that forms the membrane. An opening left in the membrane (not shown) allows the sacrificial layer to be removed in a post-processing etch. A typical etchant for oxide is concentrated hydrofluoric acid (HF). In this processing step nipple 52 acts to keep the membrane from sticking to the underlying surface when the liquid etchant capillary forces pull it down.

Figure 2:
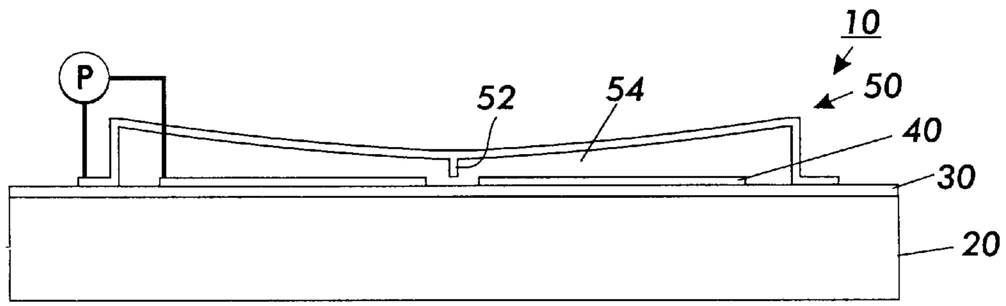
FIG. 2 shows a cross-sectional view of the electrostatically actuated diaphragm with in an intermediate displacement position.

FIG. 2 is a cross-sectional view of electrostatically actuated diaphragm 10 which has been displaced from its relaxed position by an application of a voltage or current between membrane 50 and conductor 40. The motion of membrane 50 then reduces the actuator chamber volume. Actuator chamber 54 can either be sealed at some reduced pressure, or open to atmosphere to allow the air in the actuator chamber to escape (hole not shown). For gray scale printing the membrane can be pulled down to an intermediate position. The volume reduction in the actuator chamber will later determine the volume of fluid displaced when a nozzle plate has been added as discussed below.

Figure 3:
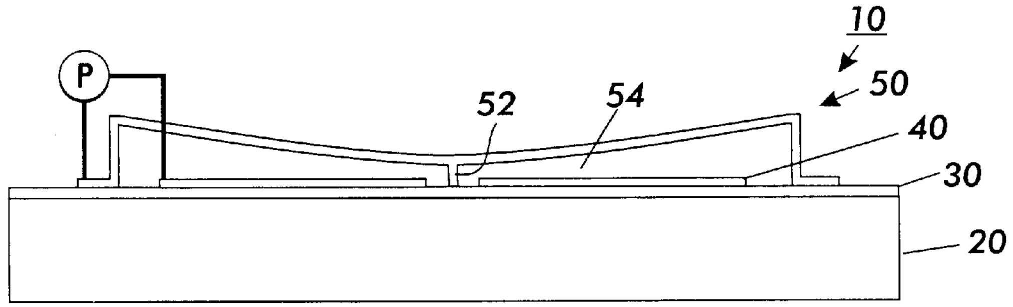
FIG. 3 shows a cross-sectional view of the electrostatically actuated diaphragm in the maximum displacement position.

FIG. 3 shows a cross-sectional view of electrostatically actuated diaphragm 10 which has been pulled-down towards conductor 40. Nipple 52 on membrane 50 lands on insulating film 30 and acts to keep the membrane from contacting the conductor. This represents the maximum amount of volume reduction possible in the actuator chamber.

Figure 4:
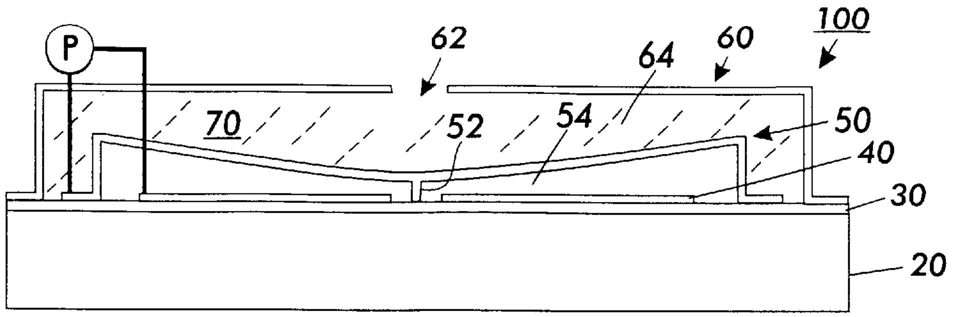
FIG. 4 shows a cross-sectional view of the electrostatically actuated fluid ejector in the maximum displacement position.

FIG. 4 shows a cross-sectional view of an electrostatically actuated fluid ejector 100. Nozzle plate 60 is located above electrostatically actuated membrane 50, forming a fluid pressure chamber 64 between the nozzle plate and the membrane. Nozzle plate 60 has nozzle 62 formed therein. Fluid 70 is fed into this chamber from a fluid reservoir (not shown). The fluid pressure chamber can be separated from the fluid reservoir by a check valve to restrict fluid flow from the fluid reservoir to the fluid pressure chamber. The membrane is initially pulled-down by an applied voltage or current. Fluid fills in the volume created by the membrane deflection.

Figure 5:
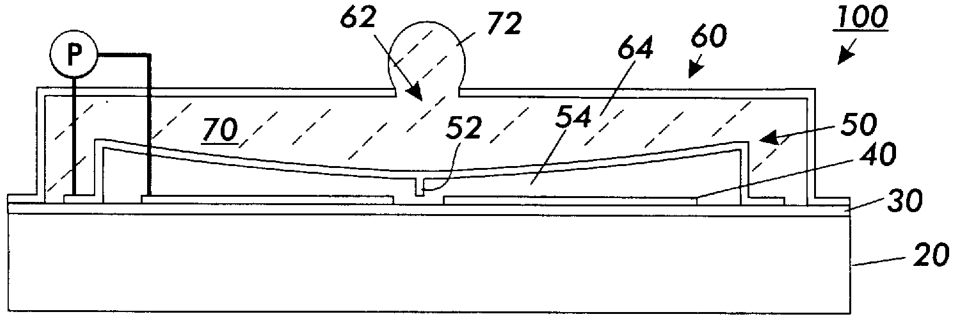
FIG. 5 shows a cross-sectional view of the electrostatically actuated fluid ejector in an intermediate displacement position.

FIG. 5 shows a cross-sectional view of the electrostatically actuated fluid ejector when the bias voltage or charge is eliminated. As the bias voltage or charge is eliminated, the membrane relaxes, increasing the pressure in the fluid pressure chamber. As the pressure increases, fluid 72 is forced out of the nozzle formed in the nozzle plate.

Figure 6:
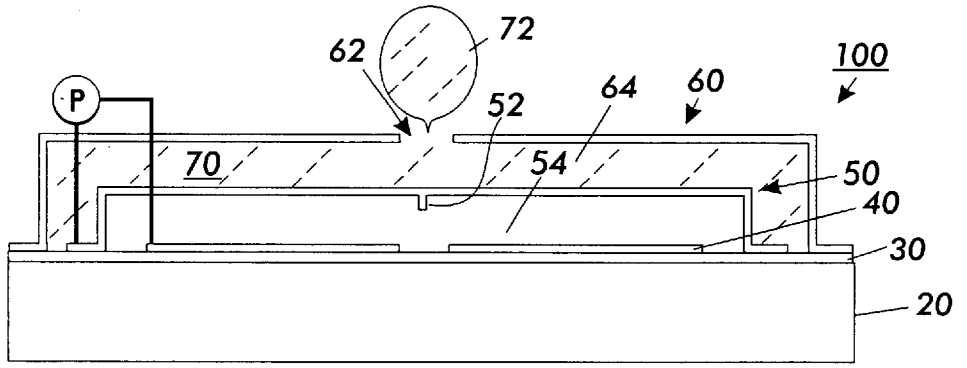
FIG. 6 shows a cross-sectional view of the electrostatically actuated fluid ejector in the relaxed state.

FIG. 6 is a cross-sectional view of the electrostatically actuated fluid ejector with the membrane back to its relaxed position. In the relaxed position, the membrane 50 has expelled a fluid drop 72 from pressure chamber 64. When the fluid ejector is used for marking, fluid drop 72 is directed towards a receiving medium (not shown).

As shown in FIGS. 1–3, the drop ejector utilizes deformable membrane 50 as an actuator. The membrane can be formed using standard polysilicon surface micromachining, where the polysilicon structure that is to be released is deposited on a sacrificial layer that is finally removed. Electrostatic forces between deformable membrane 50 and conductor 40 deform the membrane. In one embodiment the membrane is actuated using a voltage drive mode, in which a constant bias voltage is applied between the parallel plate conductors that form the membrane and the conductor. This embodiment is useful for a drop ejector that ejects a constant drop size. In a second embodiment the membrane is actuated using a charge drive mode, wherein the charge between the parallel plate conductors is controlled. This embodiment is useful for a variable drop size ejector. The two different modes of operation, voltage drive and charge drive, lead to different actuation forces, as will now be described. Power source P is used to represent the power source for both the voltage drive and charge drive modes.

Voltage Drive Mode: For the purposes of calculating the actuation forces, the membrane-conductor system is considered as a parallel plate capacitor. To calculate the actuation force, first the energy stored between the two plates of the capacitor is calculated. For a capacitor charged to a voltage V, the stored energy is given by $\frac{1}{2}CV^2$, where C is the capacitance. For a parallel plate capacitor, the capacitance is given by $\epsilon_0 A/x$, where x is the separation between the two plates of the capacitor. The actuation force is then given by the partial derivative of the stored energy with respect to the displacement at constant voltage:

$$F_x=-\partial U/\partial x=-\partial/\partial x(\tfrac{1}{2}CV^2)=-\partial/\partial x(\tfrac{1}{2})(\epsilon_0 A/x)V^2=(\epsilon_0 A/2)(V/x)^2 \quad (1)$$

As can be seen from equation 1, the electrostatic actuation force is non-linear in both voltage and displacement. The restoring force is given by stretching of the membrane which may comprise any shape such as, for example, a circular membrane. The center deflection, x, of a circular diaphragm with clamped edges and without initial stress, under a homogeneous pressure P, is given by:

$$P=F/A_{membrane}=5.33(E/[1-\nu^2])(t/R)^4(x/t)+2.83(E/[1-\nu^2])])(t/R)^4(x/t)^3 \quad (2)$$

where E, ν, R, and t are the Young's modulus, the Poisson's ratio, the radius and the thickness of the diaphragm, respectively. The restoring force is linear in the central deflection of the membrane. Since the mechanical restoring force is linear and the actuating force is non-linear with respect to the gap spacing, the system has a well-known instability known as pull-in when the actuating force exceeds the restoring force. This instability occurs when the voltage is increased enough to decrease the gap to ⅔ of its original value. In the voltage drive mode the diaphragm is actuated between two positions, relaxed (FIG. 1) and pull-in (FIG. 3), which gives rise to a repeatable volume reduction of the actuator chamber when a voltage exceeding the pull-in voltage is applied. This is useful for a constant drop size ejector. The pull-in instability also has hysterysis since the solution for the membrane position is double valued. One solution exists for the membrane pulled down to the counterelectrode, and another solution exists for the membrane pulled down to less than ⅓ of the original gap. This allows the steady-state holding voltage to be reduced after the membrane has been pulled down by a larger pull-in voltage.

Charge Drive Mode: As before, for the purposes of calculating the actuation forces, the membrane-conductor system is considered as a parallel plate capacitor, but now the actuation force results when the capacitor is supplied with a fixed amount of charge Q. The energy stored in the capacitor is then $Q^2/2C$, where Q is the charge present on the capacitor. The actuation force is then given by the partial derivative of the stored energy with respect to the displacement at constant charge:

$$F_x=-\partial U/\partial x=-\partial/\partial x(1/2)(Q^2/C),=-\partial/\partial x(1/2)(x/\epsilon_0 A)Q^2=Q^2/2\epsilon_0 A \quad (3)$$

As can be seen from equation 3, the electrostatic actuation force is independent of the gap between the plates of the capacitor, and thus the pull-in instability described above for the voltage drive mode is avoided. This allows the deflection of the membrane to be controlled throughout the range of the gap, which gives rise to a variable volume reduction of the actuator chamber when a variable amount of charge is placed on the capacitor plates. This is useful for a variable drop size ejector.

Pull-In Voltage: The pull-in voltage for the voltage drive mode can be estimated from an analytical expression given by P. Osterberg and S. Senturia (J. Microelectromechanical Systems Vol. 6, No. 2, June 1997 pg. 107):

$$V_{PI}=[1.55\ S_n/\epsilon_0 R^2 D_n(K_n R)]^{1/2}, \text{ where} \quad (4)$$

$$D_n=1+2\{1-\cosh(1.65K_nR/2)\}/(1.65K_nR/2)\sinh(1.65K_nR/2) \quad (5)$$

$$K_n=(12S_n/B_n)^{1/2}(6)$$

$$S_n=\sigma_0 t g_0^3 \quad (7)$$

$$B_n=Et^3g_0^3/(1-\nu^2) \quad (8)$$

Here $V_{PI}$ is the pull-in voltage for a clamped circular diaphragm of radius R that is initially separated from a counterelectrode by a gap $g_0$. The membrane has a thickness t, Young's modulus E, and residual stress $\sigma_0$. $S_n$ is a stress parameter and $B_n$ is a bending parameter, and $K_n$ is a measure of the importance of stress versus bending of the diaphragm. The stress dominated limit is for $K_n$ R>>1 and the bending dominated limit is for $K_n$R<<1. This equation has been verified using coupled electromechanical modeling. For example, for E=165 GPa, ν=0.28, $\sigma_0$=14 MPa, t=2.0 μm, $g_0$=2.0 μm, R=150 μm, the results are $S_n=2.24\times10^{-16}$, $B_n=1.15\times10^{-23}$, $K_n=1.53\times10^4$, $K_n$R=2.3 (slightly stress dominated), the pull-in voltage is 88.9 volts. A nipple has been attached to the membrane in order to avoid contact. As the membrane is pulled down toward the counterelectrode the nipple lands on the insulating layer, thus avoiding contact. In this way it is not necessary to include an insulating layer between the diaphragm and the counterelectrode. Addition of an insulating layer in other ink jet designs leads to trapped charge at the interface between the dielectric and the insulator that leads to unrepeatable behavior as discussed below.

Membrane Pressure: The pressure exerted on the fluid in the pressure chamber can be calculated by approximating the membrane-counterelectrode system as a parallel plate capacitor. From equation (1), $F=(\epsilon_0 A/2)(V/x)^2$, and the pressure can be found from the ratio of the force to the area:

$$P=F/A=(\epsilon_0/2)(V/x)^2 \quad (9)$$

Which can be solved to find the voltage required to exert a given pressure:

$$V=x(2P/\epsilon_0)^{1/2} \quad (10)$$

When the gap between the membrane and counterelectrode is 1 μm, an applied voltage of 82.3 volts is required to generate an increase in pressure of 0.3 atm ($3\times10^4$ Pa) over ambient, which is sufficient to overcome the viscous and surface tension forces of the liquid in order to expel a drop 72. The field in the gap would be 82.3 volts/μm, or 82.3 MV/m. While this is beyond the 3 MV/m limit for avalanche breakdown (sparks) in macroscopic samples, it is below the limiting breakdown in microscopic samples. In microscopic samples, with gaps on the order of 1 μm, the avalanche mechanism in air is suppressed because the path length is not long enough to permit multiple collisions necessary to sustain avalanche collisions. In micron-sized gaps, the maximum field strength is limited by other mechanisms, such as field-emission from irregularities on the conductor surface. In air breakdown fields in microns sized gaps can be as large as 300 MV/m. From equation (9), a field of 300 MV/m would allow for a pressure of $3.8\times10^5$ Pa, or 3.8 atm, an order of magnitude above the pressure required to expel a fluid droplet.

Displacement Volume: To estimate the volume change associated with the displaced membrane, the cross section of the membrane is approximated as a cosine function. The edges of the membrane have zero slope due to the clamped boundary conditions, and it also has zero slope at the center of the diaphragm where the maxim displacement occurs. If the edges are at a distance R from the center of the diaphragm, the volume can be calculated by:

$$V={}^R\!\int_0(g_0/2)(1+\cos(\pi x/R))(2\pi x)dx=g_0R^2(\pi^2-4)/2\pi\approx0.93g_0R^2 \quad (11)$$

Thus for a gap of $g_0$=2 μm, a radius R=150 μm, the displacement volume would be 41.9 pL. This is about a factor of 3 greater than the drop size of a 600 spot per inch (spi) droplet (approximately 12 pL). This increase in displacement volume should allow sufficient overhead for the reduction in displacement volume associated, for example, with wall motion of the pressure chamber.

Figure 7:
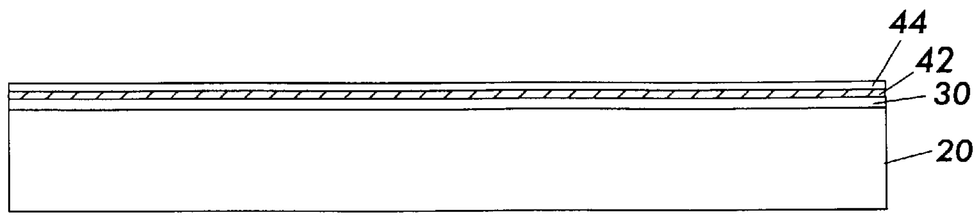
FIGS. 7–14 show cross-sectional views of the process for forming the electrostatically actuated diaphragm.

Fabrication: The drop ejector can be formed using a well known surface micromachining process as shown in FIGS. 7–14. In FIG. 7, the beginning of the wafer processing is shown. In this figure there is a silicon substrate wafer 20, a LPCVD (Low Pressure Chemical Vapor Deposition) low stress silicon nitride electrically insulating layer 30 approximately 0.5 μm thick, a 0.5 μm LPCVD low stress polysilicon layer (poly 0) 42, and a photoresist layer 44. The substrate wafer is typically a 100 mm n or p-type (100) silicon wafer of 0.5 Ω-cm resistivity. The surface of the wafer is heavily doped with phosphorous in a standard diffusion furnace using $POCl_3$ as the dopant source, to reduce charge feedthrough to the substate from electrostatic devices on the surface. Photoresist layer 44 is used for patterning the poly 0 layer 42.

Figure 8:
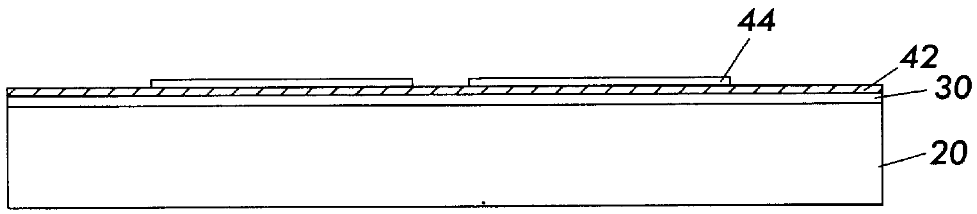
Figure 9:
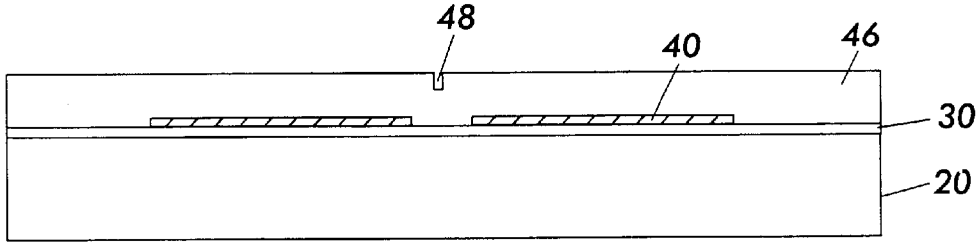

In FIG. 8, photoresist 44 is patterned, and this pattern is transferred into the poly layer 42 using Reactive Ion Etching (RIE), as shown in FIG. 9. A 2.0 μm PhosphoSilicate Glass (PSG) sacrifical layer 46 (Oxide 1) is then deposited by LPCVD. This glass layer is patterned using photoresist layer (not shown) to create a small hole 48 approximately 0.75 μm deep.

Figure 10:
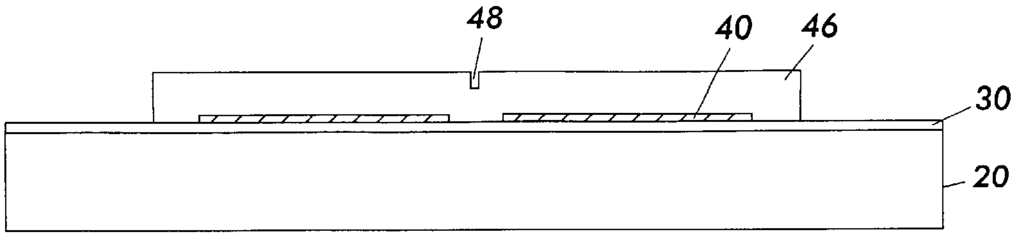
Figure 11:
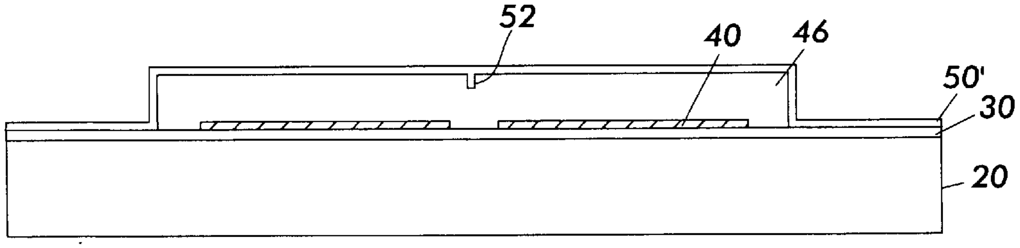

In FIG. 10, unwanted oxide 1 layer 46 is selectively removed using RIE, and then the photoresist is stripped, and an additional polysilicon 1 layer 50', approximately 2.0 μm thick is deposited, as shown in FIG. 11. This mechanical layer 50' forms the membrane actuator 50, and the refilled hole forms nipple 52 which will be used to keep the membrane from electrically contacting counterelectrode 40 formed in poly 0.

Figure 12:
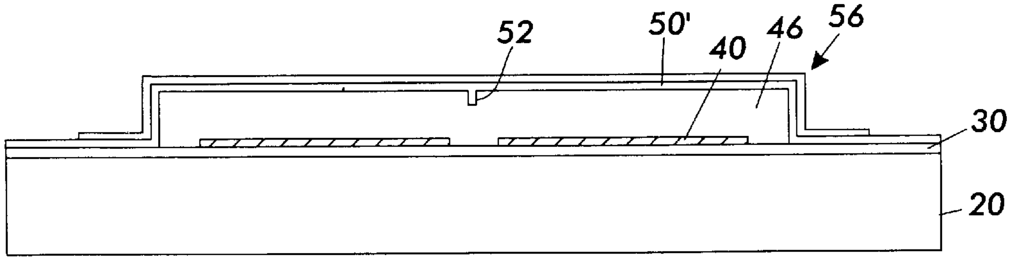
Figure 13:
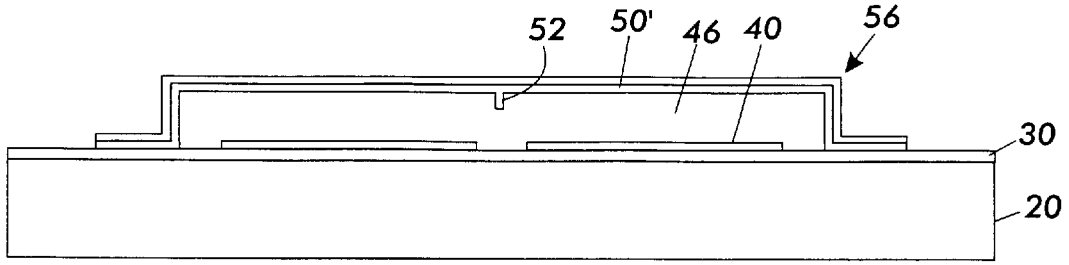
Figure 14:
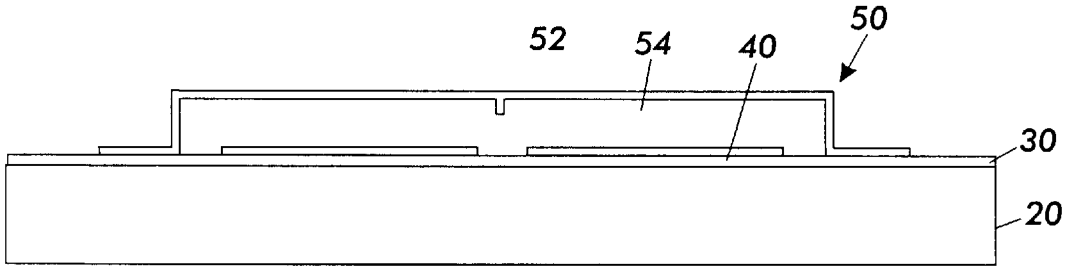

In FIGS. 12 and 13 the poly 1 layer 50' is patterned using photoresist 56. In FIG. 14 the sacrificial oxide 1 layer 46 has been etched, using wet or dry etching through a through-hole that is not shown, to release the membrane 50 so that it can be mechanically actuated. If wet etching is used to release the membrane, nipple 52 acts to keep the diaphragm from contacting substrate 20, to prevent a sticking phenomenon induced by the capillary force between the membrane and substrate. The etch hole to the sacrificial glass layer can be made from the back side of the wafer, using wet anisotropic etching technology similar to the etching technology used in forming the reservoir in state of the art thermal ink jet devices, or using dry etching techniques such as Deep Reactive Ion Etching (DRIE). The etch hole can also be formed on the front side of the wafer, by providing a continuous oxide pathway through the side of the membrane. This pathway can protected from refill by the fluid in the pressure chamber design formed in thick polyimide. It is preferable to form the etch hole from the front side of the wafer to avoid etching a deep hole through the entire thickness of the wafer.

A nozzle plate can be added by using the techniques described in the U.S. patent application Ser. No. 08/905,759 entitled "Monolithic Inkjet Print Head" referenced above. Alternatively the pressure chamber can be formed in a thick film of polyimide, similar to that used to form the channels in current thermal ink jet products which is then capped with a laser ablated nozzle plate.

We claim:

1. A method of fabricating a micro-electromechanical device, the device comprising a single semiconductor substrate having an insulating layer thereon, the method comprising:

disposing a conductor on the insulating layer, providing a polysilicon membrane, the membrane being formed by surface micromachining through the deposition and patterning of a polysilicon layer, the membrane comprising a membrane top and membrane sides, the membrane sides supporting the membrane above the conductor and the insulating layer, the membrane being conductive;

the membrane being deflectable and arranged to move towards the conductor under electrostatic attraction in response to a power source connected to the conductor and the membrane;

wherein the conductor and the membrane are formed by thin film deposition;

and wherein the membrane comprises an actuator and the micro-electromechanical device comprises an actuator device.

2. A method of fabricating a micro-electromechanical device, the device comprising a single semiconductor substrate having an insulating layer thereon, the method comprising:

disposing a conductor on the insulating layer, providing a polysilicon membrane, the membrane being formed by surface micromachining through the deposition and patterning of a polysilicon layer, the membrane comprising a membrane top and membrane sides, the membrane sides supporting the membrane above the conductor and the insulating layer, the membrane being conductive;

the membrane being deflectable and arranged to move towards the conductor in response to a power source connected to the conductor and the membrane;

wherein the conductor and the membrane are formed by surface micromachining techniques, including a step of forming a nipple on an inner surface of the top of the membrane, the nipple aligned with the insulating layer to thereby prevent the top of the membrane from contacting the conductor.

3. The method of claim 2, including a step of forming a nozzle plate surrounding the membrane, the nozzle plate having a nozzle top and nozzle sides, a pressure chamber formed between the nozzle plate and the membrane, wherein fluid is stored, a nozzle formed in the nozzle plate for ejecting fluid.

4. The method of claim 3, wherein the membrane top is circular in shape.

5. The method of claim 4, wherein the fluid comprises ink.

6. The method of claim 3, wherein the membrane top is rectangular in shape.

7. The method of claim 3, wherein the membrane top is hexagonal in shape.

8. The method of claim 3, wherein the nozzle plate comprises a polysilicon layer.

9. The method of claim 3, wherein the nozzle plate comprises a polyimide layer.

* * * * *